United States Patent [19]

Gordon et al.

[11] Patent Number: 4,728,799
[45] Date of Patent: Mar. 1, 1988

[54] HEIGHT MEASUREMENT AND CORRECTION METHOD FOR ELECTRON BEAM LITHOGRAPHY SYSTEM

[75] Inventors: James J. Gordon, Pepperell; Kenneth J. Harte, Carlisle; Vijay K. Singhal, Boston, all of Mass.

[73] Assignee: Control Data Corporation, Minneapolis, Minn.

[21] Appl. No.: 4,235

[22] Filed: Jan. 5, 1987

Related U.S. Application Data

[63] Continuation-in-part of Ser. No. 749,791, Jun. 28, 1985, abandoned.

[51] Int. Cl.$^4$ ............................................. G03F 9/00
[52] U.S. Cl. ............................ 250/492.2; 250/491.1
[58] Field of Search ............ 250/492.22, 492.2, 491.1, 250/396 R, 398

[56] References Cited

U.S. PATENT DOCUMENTS

| | | | |
|---|---|---|---|
| 4,200,794 | 4/1980 | Newberry et al. | 250/396 ML |
| 4,385,238 | 5/1983 | Westerberg et al. | 250/491.1 |
| 4,419,580 | 12/1983 | Walker et al. | 250/396 R |
| 4,467,211 | 8/1986 | Smith et al. | 250/492.2 |

Primary Examiner—Bruce C. Anderson
Assistant Examiner—Paul A. Guss
Attorney, Agent, or Firm—Charles W. Helzer; E. P. Heller, III

[57] ABSTRACT

An improved method of height measurement and correction for a two-stage deflection ("fly's eye" lens) electron beam accessed lithography system is provided which employs a height measuring transducer such as a capacitance gauge or an optical gauge and a two position fiducial calibration grid (LFG) set at positions LFG1 and LFG2 a known distance apart and wherein the electron beam of the electron beam lithography system is sequentially deflected to the two positions for each lenslet being corrected. Measurement signals derived at each position are processed pursuant to a unique algorithm to derive desired height correction output signals and height corrected deflection signals for control of the fine deflector of the electron beam lithography system.

3 Claims, 6 Drawing Figures

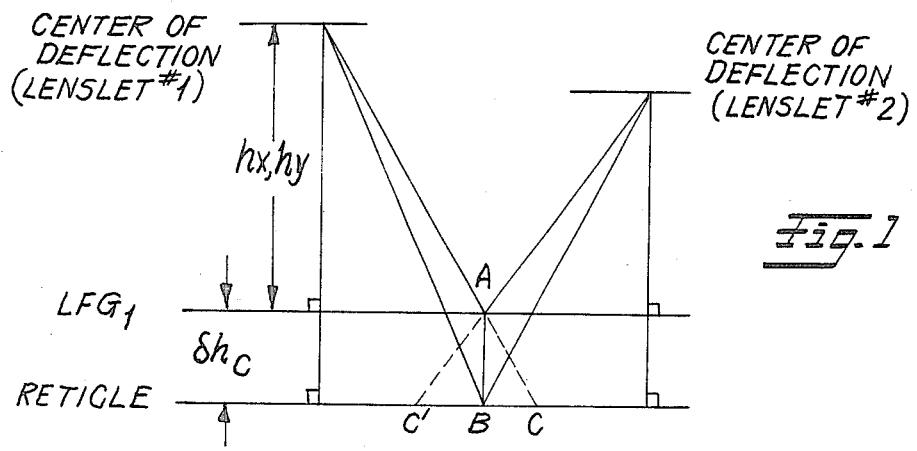
Fig. 1
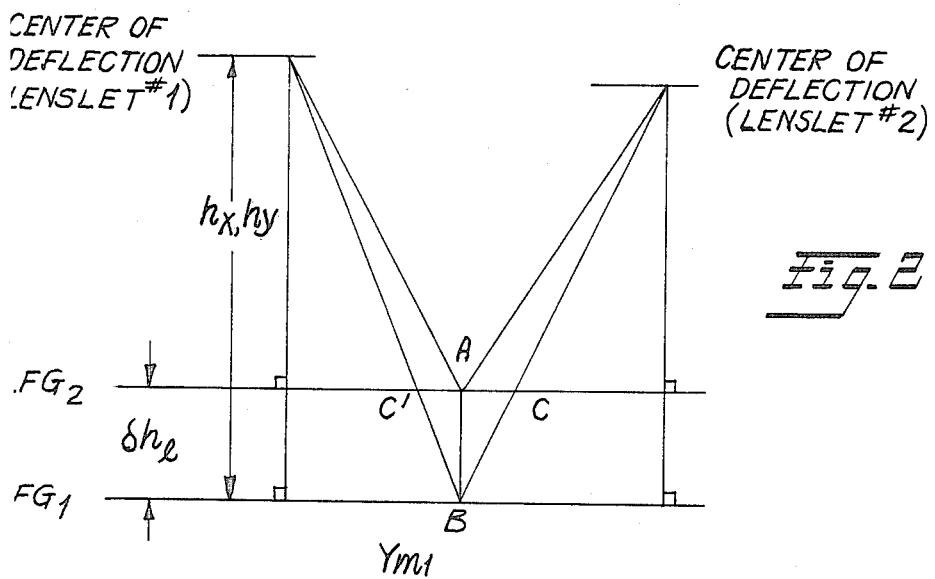
Fig. 2
Fig. 3

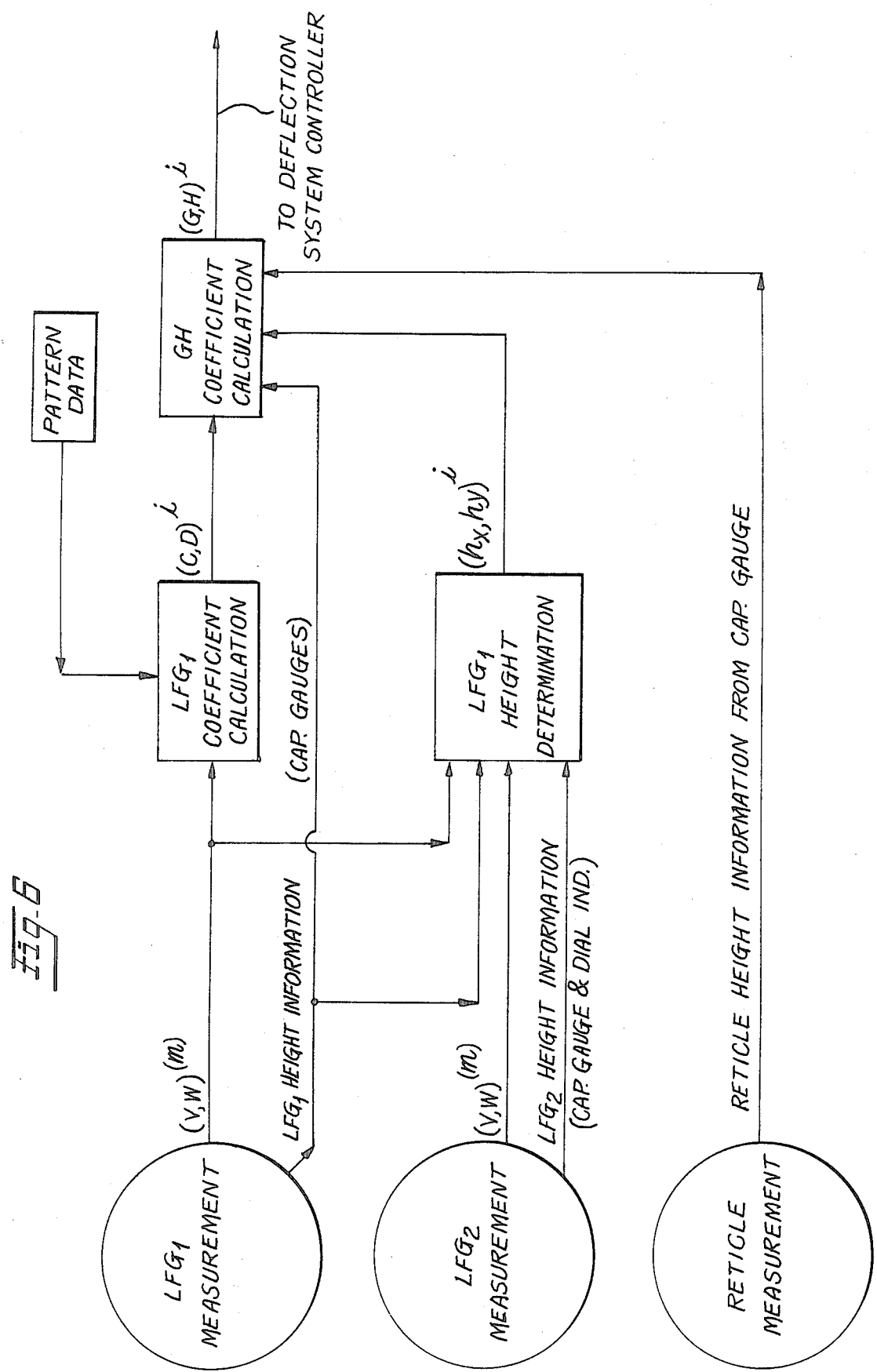

HEIGHT MEASUREMENT AND CORRECTION METHOD FOR ELECTRON BEAM LITHOGRAPHY SYSTEM

This application is a continuation-in-part of application Ser. No. 749,791, filed June 28, 1985 abandoned.

TECHNICAL FIELD

This invention relates to an electron beam lithography system and to an improved height measurement and correction method for use in such systems.

More specifically, the invention relates to an improved two grid position height measurement and correction method for compensating for differences in height between a target surface and a fiducial calibration grid referred to as a lenslet fiducial grid (LFG) employed to initially calibrate and align the electron beam of an electron beam lithography system of the two-deflector stage or fly's eye lens type, with a target surface, and to correct for non-orthogonal landing of the electron beam on the target surface.

BACKGROUND PRIOR ART PROBLEM

U.S. Pat. No. 4,467,211—issued Aug. 21, 1984 for a "Method and Apparatus for Exposing Multi-Level Registered Patterns Interchangeably Between Stations of a Multi-Station Electron Beam Array Lithography System"—Donald O. Smith and Kenneth J. Harte, inventors and assigned to Control Data Corporation, discloses an electron beam array lithography system (EBAL) to which this invention relates. U.S. Pat. No. 4,467,211, the disclosure of which hereby is incorporated in its entirety into the disclosure of this application, in the description appearing in columns 11 and 12, relating to FIGS. 5A and 5B, explains certain of the rudiments of height-effect on the electron beam of an EBAL system. The description, however, does not include a comprehensive disclosure of how to best measure and correct for height effects during operation of the system. The present disclosure describes a preferred, two LFG position height measurement and correction method for obtaining the necessary height correction values for modifying the C and D coefficients set forth in equations (1) and (2) in column 8 of U.S. Pat. No. 4,467,211 to thereby obtain corrected G and H coefficients set forth in equations (7) and (8) in column 11 for deriving appropriately corrected deflection signals for application to the EBAL system as described in the patent.

SUMMARY OF INVENTION

It is therefore a primary object of the present invention to provide an improved height measurement and correction method for compensating for differences in height between a target surface and fiducial calibration grid employed to initially calibrate and align the electron beam of an electron beam lithography system with the target surface, which is assumed to not carry fiducial marks, and to correct for non-orthogonal landing of the electron beam on the target surface.

In practicing the invention an improved method of height measurement and correction for an EBAL system is provided which employs a height measuring transducer (such as a capacitance gauge) and a two position fiducial calibration grid (LFG) set at a known distance apart and wherein the electron beam of the EBAL sequentially is deflected to the two positions of the LFG. Measurement signals are derived from the LFG at the two different positions along with the height measurement signal from the capacitance gauge or other height measuring transducer, which then are processed pursuant to a unique algorithm to derive desired height correction signals and height corrected deflection signals for application in controlling the EBAL system.

BRIEF DESCRIPTION OF DRAWINGS

These and other objects, features and many of the attendant advantages of this invention will be appreciated more readily as the same becomes better understood from a reading of the following detailed description when considered in connection with the accompanying drawings wherein like parts in each of the several figures are identified by the same reference character, and wherein:

FIG. 1 is a diagramatic sketch illustrating the stitching and registration error induced by the height difference between a first fiducial calibration grid LFG and a target surface;

FIG. 2 is a diagramatic sketch depicting how the two values $h_x$ and $h_y$ are derived by measuring the stitching and registration errors C, C' upon the two position LFG being moved a known distance $\delta h_f$ from LFG1 to LFG2;

FIG. 3 is a diagramatic sketch illustrating the parameters (a,b) for each lenslet neighboring a lenslet #1 which is to be corrected, and wherein the neighboring lenslet is a candidate for lenslet #2 in the correction method herein disclosed;

FIG. 6 is a functional, schematic block diagram illustrating a measurement and correction system constructed to practice the improved two LFG height measurement and correction method according to the invention.

BEST MODE OF PRACTICING THE INVENTION

Figure 4:
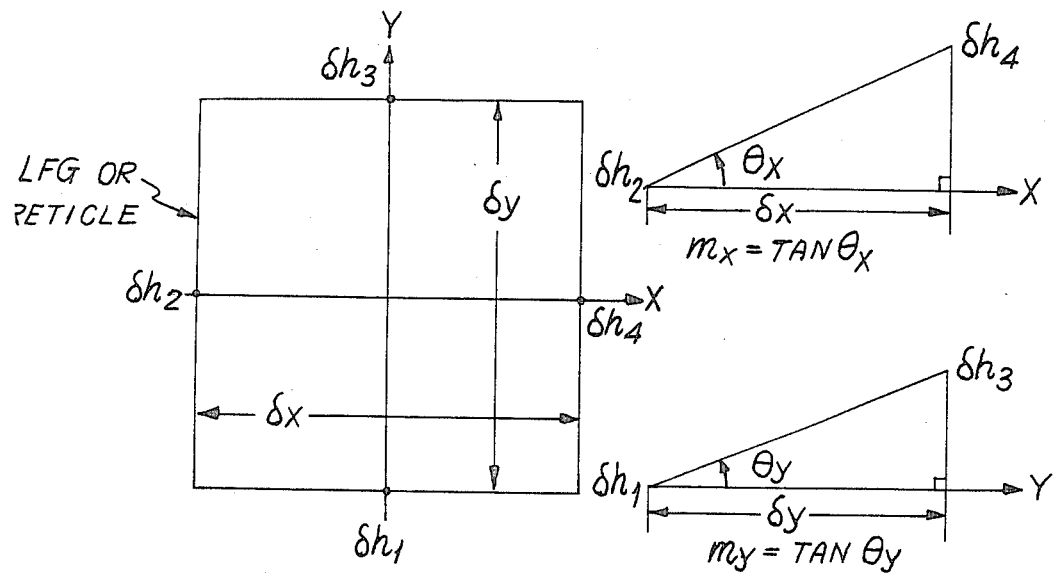
FIG. 4, depicts three diagramatic sketches illustrating the principal values derived and used for tilt correction in the event that either the LFG or target is tilted.

In an EBAL system of the type described in U.S. Pat. No. 4,467,211, an electron beam optical column with two-stage deflection is employed, having a fine, "fly's-eye" array optical assembly comprised of a plurality of parallel sets of a serially arranged, "fly's-eye" lenslet. A fine deflector is associated with each fine lenslet. Because the fine deflector does not displace the electron beam parallel to itself but changes the angle of incidence at the target plane, an image to be written on a target is magnified or reduced dependent upon the distances of the target surface from the centers of deflection of the x and y fine deflectors. This magnification leads to stitching and registration errors, but can be corrected by adjusting the stitching and registration coefficients used to develop the deflection potentials applied to the respective fine deflector.

The stitching and registration coefficients are derived from measurements made with respect to the fiducial calibration grid (referred to as a lenslet fiducial grid or LFG) used to calibrate the electron-optical system as viewed through a particular fine lenslet and fine deflector sub-assembly. In FIG. 1 this fiducial calibration grid is identified as LFG1. The stitching and registration coefficients measured on LFG1 are referred to as C's and D's while those which have been corrected for height pursuant to the present invention will be referred to as G's and H's. The corrections which produce the G's and H's from the C's and D's is determined by the values $\Delta h_{xo} = \delta h_c/h_x$ and $\Delta h_{yo} = \delta h_c/h_y$ where $\delta h_c$ is the difference in height between the target surface and LFG1 and $h_x$ and $h_y$ are respectively the heights of the centers of deflection of the x and y deflectors immediately above LFG1 as shown in FIG. 1 of the drawings. Since each lenslet in the fly's-eye lenslet array has its own set of C's and D's and its own set of fine deflectors, this height correction must be performed for each lenslet in the array. As illustrated in FIG. 1, the C's and D's allow a stitched pattern to be written at point A at the same height as the LFG1 but results in stitching error, C, C' on the target plane. Deflection voltages must be computed from adjusted coefficients (G's and H's) which allow the stitched pattern to be imaged on the target plane at point B.

The value $\delta h_c$ may be determined by measurement with a suitable transducer such as a capacitance gauge or an optical gauge, which thereafter is corrected as described hereinafter. However, such methods of measurement are not satisfactory for use in determining the value $h_x$ and $h_y$ for the respective x and y deflectors of each lenslet.

Since all voltage measurements (e.g. those used to compute the C's and D's) are made at LFG1 alone, and since there are no fiducials on the target plane, there is no sufficiently accurate experimental method for finding $h_x$ and $h_y$ unless a second fiducial calibration grid LFG2 is inserted at a known height difference $\delta h_l$ from LFG1 as shown in FIG. 2 of the drawings. In FIG. 2, it is seen that the C's and D's allow a stitched pattern to be written at LFG1 height (point B), but result in stitching and registration error C, C' on LFG2. G's and H's can be found to account for this error and produce a stitched pattern on LFG2 at point A. The $h_x$ and $h_y$ values then are found from transformation on the C's and D's needed to produce these G's and H's. This is done by measuring the C's and D's on LFG1 and the stitching and registration error which their use would produce on LFG2. From these values it is possible to discover by how much the voltages given by the C's and D's must be corrected to produce a stitched pattern at A on LFG2. The correction is entirely determined by the quantities $$\Delta h_{xo} = \delta h_l/h_x \text{ and } \Delta h_{yo} = \delta h_l/h_y \quad (1)$$

which are in turn determined by the stitching error measured on LFG2 in FIG. 2. However, $\delta h_l$ is a known value so that one may solve immediately for the values of $h_x$ and $h_y$ to obtain a sufficiently accurate value for these quantities.

In order to derive a sufficiently accurate measurement of the values $\Delta h_{xo}$ and $\Delta h_{yo}$, the expressions for the voltages to be applied to the respective x and y deflectors of a given lenslet are written in terms of the C's and D's, $\Delta h_{xo}$ and $\Delta h_{yo}$, using i to designate the lenslet to whose deflector blades the voltages are to be applied, in accordance $$v_i = C_{03}^{(i)} \cdot Y_{mi}^3 + \quad (2)$$

-continued $$X_{mi} Y_{mi}^2 + \left( \frac{C_{12}^{(i)}}{(\Delta h_{xo} + 1) \cdot (\Delta h_{yo} + 1)^2} + \frac{(C_{10}^{(i)} + 1) \cdot p_y^{(i)} \cdot \Delta h_{xo}}{(\Delta h_{xo} + 1)^2 \cdot (\Delta h_{yo} + 1)^2} \right) \cdot$$

$$X_{mi} Y_{mi}^2 + \left( \frac{C_{02}^{(i)}}{(\Delta h_{yo} + 1)^2} + \frac{C_{00}^{(i)} \cdot p_y^{(i)} \cdot \Delta h_{xo}}{(\Delta h_{xo} + 1)^2 \cdot (\Delta h_{yo} + 1)^2} \right) \cdot$$

$$Y_{mi}^2 + \frac{C_{21}^{(i)}}{(\Delta h_{xo} + 1)^2 \cdot (\Delta h_{yo} + 1)} \cdot X_{mi}^2 Y_m +$$

$$\frac{C_{11}^{(i)}}{(\Delta h_{xo} + 1) \cdot (\Delta h_{yo} + 1)} \cdot X_{mi} Y_{mi} +$$

$$\left( \frac{C_{30}^{(i)}}{(\Delta h_{xo} + 1)^3} + \frac{(C_{10}^{(i)} + 1) \cdot p_x^{(i)} \cdot \Delta h_{xo}}{(\Delta h_{xo} + 1)^4} \right) \cdot$$

$$X_{mi}^3 + \left( \frac{C_{20}^{(i)}}{(\Delta h_{xo} + 1)^2} + \frac{C_{00}^{(i)} \cdot p_x^{(i)} \cdot \Delta h_{xo}}{(\Delta h_{xo} + 1)^4} \right) \cdot$$

$$X_{mi}^2 + \frac{C_{01}^{(i)}}{\Delta h_{xo} + 1} \cdot Y_{mi} + \frac{(C_{10}^{(i)} + 1)}{\Delta h_{xo} + 1} \cdot X_{mi} + \frac{C_{00}^{(i)}}{\Delta h_{xo} + 1}$$

$$w_i = D_{03}^{(i)} \cdot X_{mi}^3 + \quad (3)$$

$$\left( \frac{D_{21}^{(i)}}{(\Delta h_{xo} + 1)^2 \cdot (\Delta h_{yo} + 1)} + \frac{(D_{01}^{(i)} + 1) \cdot q_x^{(i)} \cdot \Delta h_{yo}}{(\Delta h_{xo} + 1)^2 \cdot (\Delta h_{yo} + 1)^2} \right) \cdot$$

$$X_{mi}^2 Y_{mi} + \left( \frac{D_{20}^{(i)}}{(\Delta h_{xo} + 1)^2} + \frac{D_{00}^{(i)} \cdot q_x^{(i)} \cdot \Delta h_{yo}}{(\Delta h_{xo} + 1)^2 \cdot (\Delta h_{yo} + 1)^2} \right) \cdot$$

$$X_{mi}^2 + \frac{D_{12}^{(i)}}{(\Delta h_{xo} + 1) \cdot (\Delta h_{yo} + 1)^2} \cdot$$

$$X_{mi} Y_{mi}^2 + \left( \frac{D_{03}^{(i)}}{(\Delta h_{yo} + 1)^3} + \frac{(D_{01}^{(i)} + 1) \cdot q_y^{(i)} \cdot \Delta h_{yo}}{(\Delta h_{yo} + 1)^4} \right) \cdot$$

$$Y_{mi}^3 + \left( \frac{D_{02}^{(i)}}{(\Delta h_{yo} + 1)^2} + \frac{D_{00}^{(i)} \cdot q_y^{(i)} \cdot \Delta h_{yo}}{(\Delta h_{yo} + 1)^4} \right) \cdot$$

$$Y_{mi}^2 + \frac{D_{10}^{(i)}}{\Delta h_{yo} + 1} \cdot X_{mi} + \frac{(D_{01}^{(i)} + 1)}{\Delta h_{yo} + 1} \cdot Y_{mi} + \frac{D_{00}^{(i)}}{\Delta h_{yo} + 1}$$

The stitching and registration error in voltage space at a fiducial on the LFG1 and LFG2 can be found by measuring the voltages needed to access the fiducial from two neighboring lenslets as depicted in FIG. 2. If we assume that the centers of deflection of both lenslets 1 and 2 are the same distance above LFG1 (which is true to + or −0.5 mil) these voltage measurements give rise to four equations such as (1) and (2) above in the six unknowns $\Delta h_{xo}$, $\Delta h_{yo}$, $X_{m1}$, $Y_{m1}$, $X_{m2}$ and $Y_{m2}$. Since $(X_{m1}, Y_{m1})$ and $(X_{m2}, Y_{m2})$ are ideal mathematical locations of the same fiducial, the additional expression $X_{m2} = X_{m1} + a$ and $Y_{m2} = Y_{m1} + b$ are true, where (a,b) are the coordinates of the center of lenslet 1 in the coordinate system with origin at the center of lenslet 2 as illustrated in FIG. 2. From FIG. 3, it will be seen that each lenslet neighboring the lenslet identified as "lenslet 1" is a candidate to become "lenslet 2" in the arrangement depicted in FIGS. 1 and 2.

By employing the additional expressions $X_{m1}+a$ and $Y_{m1}+b$, there becomes six equations and six unknowns, and this system may be solved in particular for the values $\Delta h_{xo}$ and $\Delta h_{yo}$ by standard procedures, such as the Newton-Raphson iteration technique. Once $\Delta h_{xo}$ and $\Delta h_{yo}$ are found in this way, $h_x$ and $h_y$ are immediately obtainable from equation (1) since $\delta h_l$ is known.

Studies of the above-described non-linear system have shown that a successive substitutions solution is just as accurate as the Newton-Raphson iteration technique, and requires less total computer time to evaluate. Hence, the successive substitution method is the one chosen for use and is the method described hereinafter.

The method of successive substitution used in solving the above-defined non-linear system consists in isolating the desired variable on the left-hand side of the equation, choosing an initial guess for its value, and using the equation to generate a new guess. This process is repeated continuously until two consecutive guesses are within the desired accuracy of each other. For example, consider the equation $$x^3 - 7x + 5 = 0 \qquad (4)$$

Adding subscripts to indicate each iteration, one writes this as $$x_{n+1} = 1/7(x_n^3 + 5)$$

Choosing as an initial guess $x_o = 1$, one finds that $$|x_7 - x_6| < 10^{-4} \text{ and } x_7 = 0.7828.$$

In fact $x_7^3 - 7x_7 + 5 \neq 8 \times 10^{-5}$, so $x_7$ is a good approximate solution of equation (4).

Applying the same successive substitution method to the variables in the non-linear system, and again using the subscript n to indicate iteration, the auxiliary functions are defined as follows:

$$\alpha_n(i,a,b) \equiv v_i - C_{03}^{(i)}(Y_{m1,n} + b)^3 -$$

$$\left( \frac{C_{20}^{(i)}}{(\Delta h_{xo,n} + 1)^2} + \frac{C_{00}^{(i)} \cdot p_x^{(i)} \cdot \Delta h_{xo,n}}{(\Delta h_{xo,n} + 1)^4} \right) \cdot (X_{m1,n} + a)^2 -$$

$$\left( \frac{C_{12}^{(i)}}{(\Delta h_{xo,n} + 1) \cdot (\Delta h_{yo,n} + 1)^2} + \right.$$

$$\left. \frac{(C_{10}^{(i)} + 1) \cdot p_y^{(i)} \cdot \Delta h_{xo,n}}{(\Delta h_{xo,n} + 1)^2 \cdot (\Delta h_{yo,n} + 1)^2} \right) \cdot (X_{m1,n} + a) \cdot (Y_{m1,n} + b)^2 -$$

$$\left( \frac{C_{02}^{(i)}}{(\Delta h_{yo,n} + 1)^2} + \frac{C_{00}^{(i)} \cdot p_y^{(i)} \cdot \Delta h_{xo,n}}{(\Delta h_{xo,n} + 1)^2 \cdot (\Delta h_{yo,n} + 1)^2} \right) \cdot$$

$$(Y_{m1,n} + b)^2 - \frac{C_{01}^{(i)}}{\Delta h_{xo,n} + 1} (Y_{m1,n} + b) -$$

-continued $$\left( \frac{C_{30}^{(i)}}{(\Delta h_{xo,n} + 1)^3} + \frac{(C_{10}^{(i)} + 1) \cdot p_x^{(i)} \cdot \Delta h_{xo,n}}{(\Delta h_{xo,n} + 1)^4} \right) \cdot$$

$$(X_{m1,n} + a)^3 - \frac{C_{00}^{(i)}}{\Delta h_{xo,n} + 1} - \frac{C_{21}^{(i)}}{(\Delta h_{xo,n} + 1)^2 \cdot (\Delta h_{yo,n} + 1)} \cdot$$

$$(X_{m1,n} + a)^2 \cdot (Y_{m1,n} + b) - \frac{C_{11}^{(i)}}{(\Delta h_{xo,n} + 1) \cdot (\Delta h_{yo,n} + 1)} \cdot$$

$$(X_{m1,n} + a) \cdot (Y_{m1,n} + b)$$

$$\beta_n(i,a,b) \equiv w_i - D_{30}^{(i)} \cdot (X_{m1,n} + a)^3 -$$

$$\left( \frac{D_{02}^{(i)}}{(\Delta h_{yo,n} + 1)^2} + \frac{D_{00}^{(i)} \cdot q_y^{(i)} \cdot h_{yo,n}}{(\Delta h_{yo,n} + 1)^4} \right) \cdot (Y_{m1,n} + b)^2 -$$

$$\left( \frac{D_{21}^{(i)}}{(\Delta h_{xo,n} + 1)^2 \cdot (\Delta h_{yo,n} + 1)} + \right.$$

$$\left. \frac{(D_{01}^{(i)} + 1) \cdot q_x^{(i)} \cdot \Delta h_{yo,n}}{(\Delta h_{xo,n} + 1)^2 \cdot (\Delta h_{yo,n} + 1)^2} \right) \cdot (X_{m1,n} + a)^2 \cdot (Y_{m1,n} + b) -$$

$$\left( \frac{D_{20}^{(i)}}{(\Delta h_{xo,n} + 1)^2} + \frac{D_{00}^{(i)} \cdot q_x^{(i)} \cdot \Delta h_{yo,n}}{(\Delta h_{xo,n} + 1)^2 \cdot (\Delta h_{yo,n} + 1)^2} \right) \cdot$$

$$(X_{m1,n} + a)^2 - \frac{D_{10}^{(i)}}{\Delta h_{yo,n} + 1} \cdot (X_{m1,n} + a) -$$

$$\left( \frac{D_{03}^{(i)}}{(\Delta h_{yo,n} + 1)^3} + \frac{(D_{01}^{(i)} + 1) \cdot q_y^{(i)} \cdot \Delta h_{yo,n}}{(\Delta h_{yo,n} + 1)^4} \right) \cdot$$

$$(Y_{m1,n} + b)^3 - \frac{D_{00}^{(i)}}{\Delta h_{yo,n} + 1} - \frac{D_{12}^{(i)}}{(\Delta h_{xo,n} + 1) \cdot (\Delta h_{yo,n} + 1)^2} \cdot$$

$$(x_{m1,n} + a) \cdot (Y_{m1,n} + b)^2 - \frac{D_{11}^{(i)}}{(\Delta h_{xo,n} + 1) \cdot (\Delta h_{yo,n} + 1)} \cdot$$

$$(X_{m1,n} + a) \cdot (Y_{m1,n} + b)$$

Note that the variables $X_{m2}$ and $Y_{m2}$ have been eliminated from these functions through the use of a and b.

From equations (2) and (3), the following iteration formulae may be derived:

$$X_- + 1 = \left( \frac{\Delta h_{xo,n} + 1}{C_{10}^{(1)} + 1} \right) \alpha_n(1,0,0); \quad C_{10}^{(1)} \neq -1$$

$$Y_{m1,n} + 1 = \left( \frac{\Delta h_{yo,n} + 1}{D_{01}^{(1)} + 1} \right) \beta_n(1,0,0); \quad D_{01}^{(1)} \neq -1$$

$$\Delta h_{xo,n} + 1 = \{(C_{10}^{(1)} - C_{10}^{(2)}) \cdot X_{m1,n} - a \cdot (C_{10}^{(2)} + 1)\} \cdot$$

$$\{\alpha_n(1,0,0) - \alpha_n(2,a,b)\}^{-1} - 1$$

$$\Delta h_{yo,n} + 1 = \{(D_{01}^{(1)} - D_{01}^{(2)}) \cdot Y_{m1,n} - b \cdot (D_{01}^{(2)} + 1)\} \cdot$$

-continued
$$\{\beta_n(1,0,0) - \beta_n(2,a,b)\}^{-1} - 1$$

As initial guesses, $X_{m1,0}$ and $Y_{m1,0}$ should be set to their ideal values (e.g., if fiducial #2 of lenslet #1 is being measured, $(X_{m1,0}, Y_{m1,0})=(1,1)$) and $\Delta h_{x0,0}$ and $\Delta h_{y0,0}$ should both be set to zero. The convergence criteria will depend on the word-size of the computer used to evaluate the iteration formulae. For 16-bit arithmetic, the appropriate criteria are $$|X_{m1,n+1}-X_{m1,n}|, |Y_{m1,n+1}-Y_{m1,n}|,$$
$$|\Delta h_{xo,n+1}-\Delta h_{xo,n}|,$$

and $$|\Delta h_{yo,n+1}-\Delta h_{yo,n}|$$

all less than $10^{-6}$.

It should be noted that the above briefly-described successive substitution system approaches degeneracy if either $a=0$ or $b=0$. This suggests that only diagonal neighbors as shown in FIG. 3 should be used as lenslet 2 for measuring height unless some means for dealing with the degeneracy is incorporated into the above scheme. To increase the accuracy of the method, the height measurement iteration should be done for all four diagonal neighbors and the average results used to obtain $h_x$ and $h_y$ for lenslet 1.

Thus far in the description it has been tacitly assumed that both LFG's and the reticle are all perfectly flat and positioned perpendicular to the optical axis of each fine lenslet and fine deflector sub-system. In reality neither of these assumptions is true, but it is certainly desirable to account at least for tilt.

Upon tilt being introduced into the calculations, the values of $\Delta h_c$ and $\Delta h_l$ become functions of position on the reticle and LFG1, respectively rather than simple constants. For these quantities, a best plane may be fit through a set of measurements to specify the functional dependence on position. Then the coordinates of the centers of each lenslet are used to find the appropriate values of $\Delta h_c$ and $\Delta h_l$ to be used in the calculation of $h_x$, $h_y$ and the G's and H's for that lenslet.

If four measurements are obtained at symmetric locations on the LFG or reticle plates as shown in FIG. 4, the functional dependence is given by $$\Delta h = \overline{\delta h} + m_x X + m_y Y$$

where
$\overline{\delta h} = (\delta h_1 + \delta h_2 + \delta h_3 + \delta h_4)/4,$
$m_x = (\delta h_4 - \delta h_2)/\delta x,$
$m_y = (\delta h_3 - \delta h_1)/\delta y$
and $(X,Y)$ is the position in question in a global coordinate system with the origin at the center of the plate in question.

This form of tilt correction can be shown to be equivalent to a least-squares fit. The measurements, of course, are not going to be provided in practice at the ideal location shown in FIG. 4. If desired, necessary corrections to the above method can be provided for certain non-ideal locations. It is also possible under certain operating conditions that only three measurements can be obtained. Treatment for this situation also can be provided as well as the situation where two or more missing capacitance gauge measurements occur.

Figure 5:
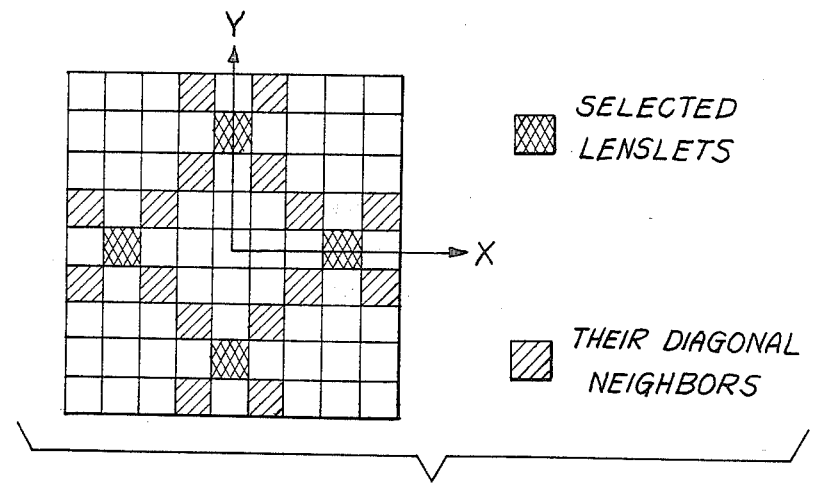
FIG. 5 is a diagramatic sketch together with keys illustrating those lenslets which are selected for height measurement iteration.

If it is assumed that tilt is the principal cause of lenslet-to-lenslet height variation, the height measurement iteration discussed in the preceeding description need be done at only four symmetric locations on LFG2 as shown in FIG. 5 of the drawings. A technique similar to that given above can be applied to these four measurements to produce suitably accurate $h_x$ and $h_y$ values for each lenslet.

When the electron beam focus is changed in order to access the fiducials on LFG2 while performing the height and measurement iteration described above, the beam deflects by a small amount. This small beam deflection called "sweep" could give rise to an error in locating the fiducial in voltage space, and hence to an error in the measurement of the stitching and registration error on LFG2. This error would result in an error in the determination of $\Delta h_{xo}$ and $\Delta h_{yo}$, if uncorrected. Fortunately, however, the sweep reverses itself when the corresponding fiducials on LFG1 are accessed. Thus, if the C's and D's are computed on LFG2 and stitching errors measured at corresponding fiducials on LFG1, an equal and opposite sweep-induced error is introduced into $\Delta h_{xo}$ and $\Delta h_{yo}$. If corresponding quantities are averaged, the effect of the lenslet sweep cancels out. It should be noted, however, the signs of both $\Delta h_{xo}$ and $\Delta h_{yo}$ change when the roles of LFG1 and LFG2 are reversed due to the sign convention on $\Delta h_l$. Hence, if $\Delta h_{xo}$ and $\Delta h_{yo}$ are the values computed using C's and D's measured on LFG1 and stitching and registration errors on LFG2, and if $\Delta h_{xo}'$ and $\Delta h_{yo}'$ are the values computed using the C's and D's measured on LFG2 and stitching and registration errors measured on LFG1, the correct averages to take are $$\overline{\Delta h_{xo}} = \frac{\Delta h_{xo} - \Delta h_{xo}'}{2 - \frac{\Delta h_{xo}}{1 - \Delta h_{xo}}} \text{ and } \overline{\Delta h_{yo}} = \frac{\Delta h_{yo} - \Delta h_{yo}'}{2 - \frac{\Delta h_{yo}}{1 - \Delta h_{yo}}} \quad (5)$$

This averaging for the lenslet sweep should be carried out at all four selected lenslet locations shown in FIG. 5.

The algorithm for the two LFG height measurement and correction method according to the invention is summarized in the following procedure:
1. Calculate tilt correction for $\Delta h_l$.
2. At each selected lenslet (FIG. 5)
   a. Measure C's and D's on LFG1.
   b. For each diagonal neighbor, perform height measurement iteration using stitching errors measured on LFG2.
   c. Average each set of four values obtained in step 2b and call the results $\Delta h_{xo}$ and $\Delta h_{yo}$.
   d. Measure C's and D's on LFG2.
   e. For each diagonal neighbor, perform height measurement iteration using stitching errors measured on LFG1.
   f. Average each set of four values obtained in step 2e and call the results $\Delta h_{xo}'$ and $\Delta h_{yo}'$
   g. Calculate $\Delta h_{xo}$ and $\Delta h_{yo}$ according to equation (5).
   h. Using the tilt-corrected value of $\delta h_l$ at the center of the selected lenslet, calculate $$h_x = \delta h_l / \overline{\Delta h_{xo}} \text{ and } h_y = \delta h_l / \overline{\Delta h_{yo}}.$$

3. Calculate tilt correction using the four values of $h_x$ obtained in step 2.
4. Calculate the tilt-corrected value of $h_x$ at the center of every lenslet.

5. Repeat steps 3 and 4 for $h_y$.
6. Calculate tilt correction for $\delta h_c$.
7. At each lenslet:
   a. Use the tilt-corrected value of $\Delta h_c$ at the center of this lenslet and $h_x$ and $h_y$ for this lenslet to find $\Delta h_{xo} = \delta h_c / h_x$ and $\Delta h_{yo} = \delta h_c / h_y$.
   b. Use the C's and D's for this lenslet measured on LFG1 and $\Delta h_{xo}$ and $\Delta h_{yo}$ from step 7a to find G's and H's for this lenslet according to the following expressions:

$$G_{00} = C_{00} \cdot (\Delta h_{x0} + 1)^{-1}$$

$$G_{01} = C_{01} \cdot (\Delta h_{x0} + 1)^{-1}$$

$$G_{02} = C_{02} \cdot (\Delta h_{y0} + 1)^{-2} + C_{00} \cdot p_y \cdot \Delta h_{x0} \cdot (\Delta h_{x0} + 1)^{-2} \cdot (\Delta h_{y0} + 1)^{-2}$$

$$G_{10} = (C_{10} - \Delta h_{x0}) \cdot (\Delta h_{x0} + 1)^{-1}$$

$$G_{11} = C_{11} \cdot (\Delta h_{x0} + 1)^{-1} \cdot (\Delta h_{y0} + 1)^{-1}$$

$$G_{12} = C_{12} \cdot (\Delta h_{x0} + 1)^{-1} \cdot (\Delta h_{y0} + 1)^{-2} + (C_{10} + 1) \cdot p_y \cdot \Delta h_{x0} \cdot (\Delta h_{x0} + 1)^{-2} \cdot (\Delta h_{y0} + 1)^{-2}$$

$$G_{20} = C_{20} \cdot (\Delta h_{x0} + 1)^{-2} + C_{00} \cdot p_x \cdot \Delta h_{x0} \cdot (\Delta h_{x0} + 1)^{-4}$$

$$G_{21} = C_{21} \cdot (\Delta h_{x0} + 1)^{-2} \cdot (\Delta h_{y0} + 1)^{-1}$$

$$G_{03} = C_{03}$$

$$G_{30} = C_{30} \cdot (\Delta h_{x0} + 1)^{-3} + (C_{10} + 1) \cdot p_x \cdot \Delta h_{x0} \cdot (\Delta h_{x0} + 1)^{-4}$$

$$H_{00} = D_{00} \cdot (\Delta h_{y0} + 1)^{-1}$$

$$H_{01} = (D_{01} - \Delta h_{y0}) \cdot (\Delta h_{y0} + 1)^{-1}$$

$$H_{02} = D_{02} \cdot (\Delta h_{y0} + 1)^{-2} + D_{00} \cdot q_y \cdot \Delta h_{y0} \cdot (\Delta h_{y0} + 1)^{-4}$$

$$H_{10} = D_{10} \cdot (\Delta h_{y0} + 1)^{-1}$$

$$H_{11} = D_{11} \cdot (\Delta h_{y0} + 1)^{-1} \cdot (\Delta h_{y0} + 1)^{-1}$$

$$H_{12} = D_{12} \cdot (\Delta h_{x0} + 1)^{-1} \cdot (\Delta h_{y0} + 1)^{-2}$$

$$H_{20} = D_{20} \cdot (\Delta h_{x0} + 1)^{-2} + D_{00} \cdot q_x \cdot \Delta h_{y0} \cdot (\Delta h_{x0} + 1)^{-2} \cdot (\Delta h_{y0} + 1)^{-2}$$

$$H_{21} = D_{21} \cdot (\Delta h_{x0} + 1)^{-2} \cdot (\Delta h_{y0} + 1)^{-1} + (D_{01} + 1) \cdot q_x \cdot \Delta h_{y0} \cdot (\Delta h_{x0} + 1)^{-2} \cdot (\Delta h_{y0} + 1)^{-2}$$

$$H_{03} = D_{03} \cdot (\Delta h_{y0} + 1)^{-3} + (D_{01} + 1) \cdot q_y \cdot \Delta h_{y0} \cdot (\Delta h_{y0} + 1)^{-4}$$

$$H_{30} = D_{30}$$

Where $\Delta h_{xo} = \delta h / h_x$, $\Delta h_{yo} = \delta h / h_y$; $h_x$ and $h_y$ are, respectively, the heights of the x and y centers of deflection above the surface on which the C's and D's are measured; h is the directed distance in height from the surface on which the C's and D's are measured to the surface on which the pattern is to be written; and $p_x$, $p_y$, $q_x$, and $q_y$ are constants obtained from either computer simulation or direct analysis of the geometry of the fine deflector.

For the double dipole deflector of U.S. Pat. No. 4,467,211, $$p_x = \frac{-2 L_x}{(L_x + 2L_y + 2S + 2T)} \cdot$$

$$p_y = \frac{-2(L_x + 2L_y + 2S)}{(L_x + 2L_y + 2S + 2T)(L_y + 2T)^2}, \quad q_x = 0, \text{ and}$$

$$q_y = \frac{-2L_y}{(L_y + 2T)^3} \cdot$$

where $L_x$ represents the length of the x-deflector blades, $L_y$ the length of the y-deflector blades, S the separation between the deflector segments, and T the distance from the exit of the y-deflector to LFG1.

FIG. 6 of the drawings is a functional block diagram of a system designed to carry out the novel two LFG height position measurement and correction method according to the invention. In FIG. 6 the two LFG1 and LFG2 measurements may be obtained from two separate fiducial calibration grids built into the EBAL system. Preferably, however, only a single fiducial calibration grid whose vertical position in the electron-optical column is moved from LFG1 to LFG2, either manually or automatically by a grid position translation mechanism under the control of the individual EBAL system station control computer, during each measurement. The blocks labelled LFG1 Coefficient Calculation, LFG1 Height Determination and GH Coefficient Calculation, may comprise either individual microcomputer data processors for performing the functions noted, or alternatively the functions could be performed in separate processing stages in a mainframe computer. The G and H height corrected output signals derived from the system are supplied to the individual station computer for the EBAL station for application via the fine deflection correction to the respective fine deflectors being accessed pursuant to U.S. Pat. No. 4,467,211.

While the above specifically described correction method and system is designed to derive height corrected deflection control signals G, H as described above, it is believed obvious to one of ordinary skill in the art that the measured signal processing can be interrupted at the point where the height values $\Delta h_{xo}$ and $\Delta h_{yo}$ are derived, and the values used to correct for or otherwise calibrate the output of the height measurement transducer such as a capacitance gauge, optical gauge or other similar measuring device. In such an arrangement, the block labelled "GH Coefficient Calculation" in FIG. 6 would be modified to eliminate the further processing required to derive the G and H values, and would provide only the processing required to derive the $\Delta h_{xo}$ and $\Delta h_{yo}$ values or the corrected capacitance gauge height reading depending on the particular requirements of an installation with which the measurement system is used.

INDUSTRIAL APPLICABILITY

The invention provides a new and improved height measurement and correction method for compensating for differences in height between a target surface and a fiducial calibration grid employed to initially calibrate and align an electron beam of an electron beam lithography system, and to correct for non-orthogonal landing of the electron beam on the target surface of such system. The electron beam lithography system thus improved is used for electron beam writing of microminiaturized circuit patterns on masks, reticles, or semiconductor target wafers in the fabrication of semiconductor microcircuit chips.

Having described one embodiment of a two LFG position height measurement and correction method and system for electron beam lithography systems according to the invention, it is believed obvious that other modifications and variations of the invention will be suggested to those skilled in the art in the light of the above teachings. It is therefore to be understood that changes may be made in the particular embodiment of the invention described which are within the full intended scope of the invention as defined by the appended claims.

What is claimed is:

1. A method of height measurement and correction for an electron beam lithography system having two-stage deflection ("fly's eye" lens type), employing a height measuring transducer and a two-position fiducial calibration grid system; said method comprising:

(1) measuring x and y deflection voltages and deriving switching and registration correction calibration C and D coefficient values for a selected lenslet of the electron beam optical column with the electron beam of that lenslet imaged on a first fiducial calibration grid position LFG1 located above a target surface of the electron beam optical column;

(2) for each four diagonal lenslets of the optical column, performing height measurement iteration using stitching and registration errors measured with respect to a second fiducial calibration grid position LFG2 a known distance $\delta h_l$ from the position of the first fiducial calibration grid position LFG1;

(3) averaging each set of four values obtained in step (2) above and identifying the results as $\Delta h_{xo}$ and $\Delta h_{yo}$;

(4) measuring x and y deflection voltages and deriving stitching and registration correction C and D coefficient values therefrom with the electron beam imaged on the second fiducial calibration grid position LFG2;

(5) for each four diagonal neighbors of a selected lenslet, performing height measurement iteration using the stitching and registration errors measured at the first fiducial calibration grid position LFG1;

(6) averaging each set of four values obtained in step (5) above and identifying the results as $\Delta h_{xo'}$ and $\Delta h_{yo'}$;

(7) calculating values $\overline{\Delta h_{xo}}$ and $\overline{\Delta h_{yo}}$ using the following equation $$\overline{\Delta h_{xo}} = \frac{\Delta h_{xo} - \Delta h_{xo}'}{2 - \frac{\Delta h_{xo}}{1 - \Delta h_{xo}}} \text{ and } \overline{\Delta h_{yo}} = \frac{\Delta h_{yo} - \Delta h_{yo}'}{2 - \frac{\Delta h_{yo}}{1 - \Delta h_{yo}}}$$

(8) using a value of $\delta h_l$ measured at the center of the selected lenslet, calculating $$h_x = \delta h_l \sqrt{\overline{\Delta h_{xo}}} \text{ and } h_y = \delta h_l \sqrt{\overline{\Delta h_{yo}}} \text{ ;}$$

(9) calculating a value of $h_x$ at the center of every lenslet; and

(10) calculating a value of $h_y$ at the center of every lenslet; and

(11) for each lenslet using a value of the height of LFG1 above the target surface $\delta h_c$ at the center of each lenslet being measured and the values of $h_x$ and $h_y$, deriving a height correction value $h_{xo}$ and $h_{yo}$ from the expression $\Delta h_{xo} = \delta h_c / h_x$ and $\delta h_{yo} = \delta h_c / h_y$.

2. A method of height measurement and correction for an electron beam lithography system having two-stage deflection ("fly's eye" lens type), employing a height measuring transducer and a two-position fiducial calibration grid system; said method comprising:

(1) measuring x and y deflection voltages and deriving stitching and registration correction calibration C and D coefficient values for a selected lenslet of the electron beam optical column with the electron beam of that lenslet imaged on a first fiducial calibration grid position LFG1 located above the target surface of the electron beam optical column;

(2) for each four diagonal neighboring lenslets of the optical column, performing height measurement iteration using stitching and registration errors measured with respect to a second fiducial calibration grid position LFG2 a known distance $\delta h_l$ from the position of the first fiducial calibration grid position LFG1;

(3) averaging each set of four values obtained in step (2) above and identifying the results as $\Delta h_{xo}$ and $\Delta h_{yo}$;

(4) measuring x and y deflection voltages and deriving stitching and registration correction calibration C and D coefficient values therefrom with the electron beam imaged on the second fiducial calibration grid position LFG2;

(5) for each four diagonal neighbors of the selected lenslet, performing height measurement iteration using the stitching and registration errors measured at the first fiducial calibration grid position LFG1;

(6) averaging each set of four values obtained in step (5) above and identifying the results as $\Delta h_{xo'}$ and $\Delta h_{yo'}$;

(7) calculating values $\overline{\Delta h_{xo}}$ and $\overline{\Delta h_{yo}}$ using the following equation $$\overline{\Delta h_{xo}} = \frac{\Delta h_{xo} - \Delta h_{xo}'}{2 - \frac{\Delta h_{xo}}{1 - \Delta h_{xo}}} \text{ and } \overline{\Delta h_{yo}} = \frac{\Delta h_{yo} - \Delta h_{yo}'}{2 - \frac{\Delta h_{yo}}{1 - \Delta h_{yo}}}$$

(8) using a value of $\delta h_l$ measured at the center of the selected lenslet, calculating $$h_x = \delta h_l \sqrt{\overline{\Delta h_{xo}}} \text{ and } h_y = \delta h_l \sqrt{\overline{\Delta h_{yo}}} \text{ ;}$$

(9) calculating a tilt correction for $\delta h_l$;

(10) calculating a tilt correction using the four values of $h_x$ obtained in step (8) above;

(11) calcualting a tilt-corrected value of $h_x$ for all of the lenslets at the center of every lenslet;

(12) repeating steps (3) and (4) to obtain a tilt corrected value for $h_y$;

(13) calculating a tilt correction value for $\delta h_o$;

(14) at each lenslet using the tilt-corrected value of the height of LFG1 above the target surface $\delta h_c$ at the center of the lenslet being corrected and the value $h_x$ and $h_y$ for this lenslet obtained from step (8) above, deriving deflection voltage values $\Delta h_{xo}$ and $\Delta h_{yo}$ for the lenslet being corrected from the expressions $\Delta h_{xo} = \delta h_c / h_x$ and $\Delta h_{yo} = \delta h_l / h_y$; and

(15) using the C and D values obtained in step (1) for the lenslet being corrected measured on the first fiducial calibration grid position LFG1 and the values $\Delta h_{xo}$ and $\Delta h_{yo}$ obtained from step (14) above, calculating the height corrected values G and H for the lenslet being corrected from the following expressions:

$G_{00} = C_{00} \cdot (\Delta h_{x0} + 1)^{-1}$ $G_{01} = C_{01} \cdot (\Delta h_{x0} + 1)^{-1}$ $G_{02} = C_{02} \cdot (\Delta h_{y0} + 1)^{-2} + C_{00} \cdot p_y \cdot \Delta h_{x0} \cdot (\Delta h_{x0} + 1)^{-2} \cdot (\Delta h_{y0} + 1)^{-2}$ $G_{10} = (C_{10} - \Delta h_{x0}) \cdot (\Delta h_{x0} + 1)^{-}$ $G_{11} = C_{11} \cdot (\Delta h_{x0} + 1)^{-1} \cdot (\Delta h_{y0} + 1)^{-1}$ $G_{12} = C_{12} \cdot (\Delta h_{x0} + 1)^{-1} \cdot (\Delta h_{y0} + 1)^{-2} + (C_{10} + 1) \cdot p_y \cdot \Delta h_{x0} \cdot (\Delta h_{x0} + 1)^{-2} \cdot (\Delta h_{y0} + 1)^{-2}$ $G_{20} = C_{20} \cdot (\Delta h_{x0} + 1)^{-2} + C_{00} \cdot p_x \cdot \Delta h_{x0} \cdot (\Delta h_{x0} + 1)^{-4}$ $G_{21} = C_{21} \cdot (\Delta h_{x0} + 1)^{-2} \cdot (\Delta h_{y0} + 1)^{-1}$ .

$G_{03} = C_{03}$ $G_{30} = C_{30} \cdot (\Delta h_{x0} + 1)^{-3} + (C_{10} + 1) \cdot p_x \cdot \Delta h_{x0} \cdot (\Delta h_{x0} + 1)^{-4}$ $H_{00} = D_{00} \cdot (\Delta h_{y0} + 1)^{-1}$ $H_{01} = (D_{01} - \Delta h_{y0}) \cdot (\Delta h_{y0} + 1)^{-1}$ $H_{02} = D_{02} \cdot (\Delta h_{y0} + 1)^{-2} + D_{00} \cdot q_y \cdot \Delta h_{y0} \cdot (\Delta h_{y0} + 1)^{-4}$ $H_{10} = D_{10} \cdot (\Delta h_{y0} + 1)^{-1}$ $H_{11} = D_{11} \cdot (\Delta h_{x0} + 1)^{-1} \cdot (\Delta h_{y0} + 1)^{-1}$ $H_{12} = D_{12} \cdot (\Delta h_{x0} + 1)^{-1} \cdot (\Delta h_{y0} + 1)^{-2}$ $H_{20} = D_{20} \cdot (\Delta h_{x0} + 1)^{-2} + D_{00} \cdot q_x \cdot \Delta h_{y0} \cdot (\Delta h_{x0} + 1)^{-2} \cdot (\Delta h_{y0} + 1)^{-2}$ $H_{21} = D_{21} \cdot (\Delta h_{x0} + 1)^{-2} \cdot (\Delta h_{y0} + 1)^{-1} + (D_{01} + 1) \cdot q_x \cdot \Delta h_{y0} \cdot (\Delta h_{x0} + 1)^{-2} \cdot (\Delta h_{y0} + 1)^{-2}$ $H_{03} = D_{03} \cdot (\Delta h_{y0} + 1)^{-3} + (D_{01} + 1) \cdot q_y \cdot \Delta h_{y0} \cdot (\Delta h_{y0} + 1)^{-4}$ $H_{30} = D_{30}$ where $\Delta h_{xo} = \delta h/h_x$, $\Delta h_{yo} = \delta h/h_y$; $h_x$ and $h_y$ are, respectively, the heights of the x and y centers of deflection above the surface on which the C's and D's are measured; $\delta n$ is the directed distance in height from the surface on which the C's and D's are measured to the target surface on which the pattern is to be written; and $p_x$, $p_y$, $q_x$ and $q_y$ are obtained from the geometry of the fine deflector and wherein for the double dipole deflector:

$$p_x = \frac{-2 L_x}{(L_x + 2L_y + 2S + 2T)},$$

$$p_y = \frac{-2(L_x + 2L_y + 2S)}{(L_x + 2L_y + 2S + 2T)(L_y + 2T)^2}, q_x = 0, \text{ and}$$

$$q_y = \frac{-2L_y}{(L_y + 2T)^3},$$

where $L_x$ represents the length of the x-deflector blades, $L_y$ the length of the y-deflector blades, S the separation between the deflector segments and T the distance from the exit of the y-deflector to LFG1.

3. An in-situ method of height measurement and calibration correction employing an electron-beam optical column having a height measuring transducer and a multi-level fiducial calibration grid system; said method comprising:

(1) performing triangulation measurements at a multiplicity of different height levels using the multi-level fiducial calibration grid system and deriving a plurality of measured signals representative of height differences between a target surface and critical fine deflection parts of the electron-beam optical column;

(2) deriving a series of height correction parameters $\Delta h_{xo}^{(i)}$ and $\Delta h_{yo}^{(i)}$ from the measured signals obtained in step (1) where (i) is an iteration series index;

(3) combining the parameters derived in step (2) with corresponding readings $c^{(i)}$ obtained from the height measuring transducer; and (4) fitting two functions $f_x$ and $f_y$ to the data obtained in steps (2) and (3) using a least-squares methodology to obtain the correction factors $\Delta h_{xo} = f_x(c)$ and $\Delta h_{yo} = f_y(c)$.

* * * * *